(12) United States Patent
Ma et al.

(10) Patent No.: US 8,068,405 B2
(45) Date of Patent: Nov. 29, 2011

(54) FERROELECTRIC MEMORY AND METHOD IN WHICH POLARITY OF DOMAIN OF FERROELECTRIC MEMORY IS DETERMINED USING RATIO OF CURRENTS

(75) Inventors: Qing Ma, San Jose, CA (US); Valluri R. Rao, Saratoga, CA (US); Li-Peng Wang, San Jose, CA (US); Nathan Franklin, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 913 days.

(21) Appl. No.: 11/772,194

(22) Filed: Jun. 30, 2007

(65) Prior Publication Data

US 2009/0003030 A1 Jan. 1, 2009

(51) Int. Cl.
G11B 9/02 (2006.01)
(52) U.S. Cl. ....................................................... 369/126
(58) Field of Classification Search ........................ None
See application file for complete search history.

(56) References Cited

U.S. PATENT DOCUMENTS

| | | | | |
|---|---|---|---|---|
| 5,512,773 | A | | 4/1996 | Wolf |
| 5,777,977 | A | * | 7/1998 | Fujiwara et al. .............. 369/126 |
| 5,835,477 | A | * | 11/1998 | Binnig et al. ................. 369/126 |
| 6,151,241 | A | | 11/2000 | Hayashi |
| 6,466,039 | B1 | | 10/2002 | Gruverman .............. 324/754.03 |
| 7,151,739 | B2 | * | 12/2006 | Cho et al. ..................... 369/126 |
| 7,218,600 | B2 | * | 5/2007 | Cho et al. ..................... 369/126 |
| 7,292,768 | B1 | * | 11/2007 | Kalinin et al. ................ 385/147 |
| 2005/0095389 | A1 | * | 5/2005 | Newns .......................... 428/64.4 |
| 2005/0147018 | A1 | * | 7/2005 | Kim et al. .................... 369/126 |
| 2006/0023606 | A1 | * | 2/2006 | Lutwyche et al. ............ 369/100 |
| 2008/0089211 | A1 | * | 4/2008 | Chu et al. ..................... 369/126 |
| 2008/0152884 | A1 | * | 6/2008 | Wang ............................ 428/220 |
| 2008/0192528 | A1 | * | 8/2008 | Siegert et al. ................. 365/145 |

FOREIGN PATENT DOCUMENTS

FR 2604805 A * 4/1988

OTHER PUBLICATIONS

Harnagea, Catalin "Local Piezoelectric Response and Domain Structures in Ferroelectric Thin Films Investigated by Voltage-Modulated Force Mircoscopy", 121 May 5, 2001.
Kalinin, Sergei V., et al., "Nanoelectromechanics of Piezoresponse Force Microscopy", *Physical Review B* 70, 184101 (2004), 24.
Kalinin, Sergei V., et al., "Imaging Mechanism of Piezoresponse Force Microscopy of Ferroelectric Surfaces", *Physical Review B*, vol. 65, 125408, (Mar. 11, 2002),11. Hidaka, T. et al., "Characteristics of PZT Thin Films as Ultra-High Density Recording Media", *Integrated Ferroelectrics*, 1997. vol. 17 (1997),319-327.
Gruverman, Alexei et al., "Nanoelectromechanics of Scanning Probe Microscopy", http://nantransport.ornl.gov/Research/nanopfm.html, (15), May 17, 2007.
Johnson, Colin R., "Researchers Demonstrate Tunable Schottky Barrier, Aim for Ferroelectric", (Jun. 23, 2003 10:43 AM EDT), http://www.eetimes.com/showArticle.jhtml?articleID=10802064, (Jun. 23, 2003).

* cited by examiner

*Primary Examiner* — Peter Vincent Agustin
*Assistant Examiner* — Mark Fischer
(74) *Attorney, Agent, or Firm* — Schubert Law Group PLLC

(57) ABSTRACT

Methods and arrangements for data storage are discussed. Embodiments include applying a first voltage between a tip and an electrode, thereby forming a polarized domain in a ferroelectric material between 1 nanometer (nm) and 50 nm in thickness. The embodiments may also include applying another voltage through the tip, thereby generating a current responsive to an orientation of the polarized domain. The embodiments may also include measuring the current and determining the orientation of the polarized domain, based upon the measuring.

20 Claims, 4 Drawing Sheets

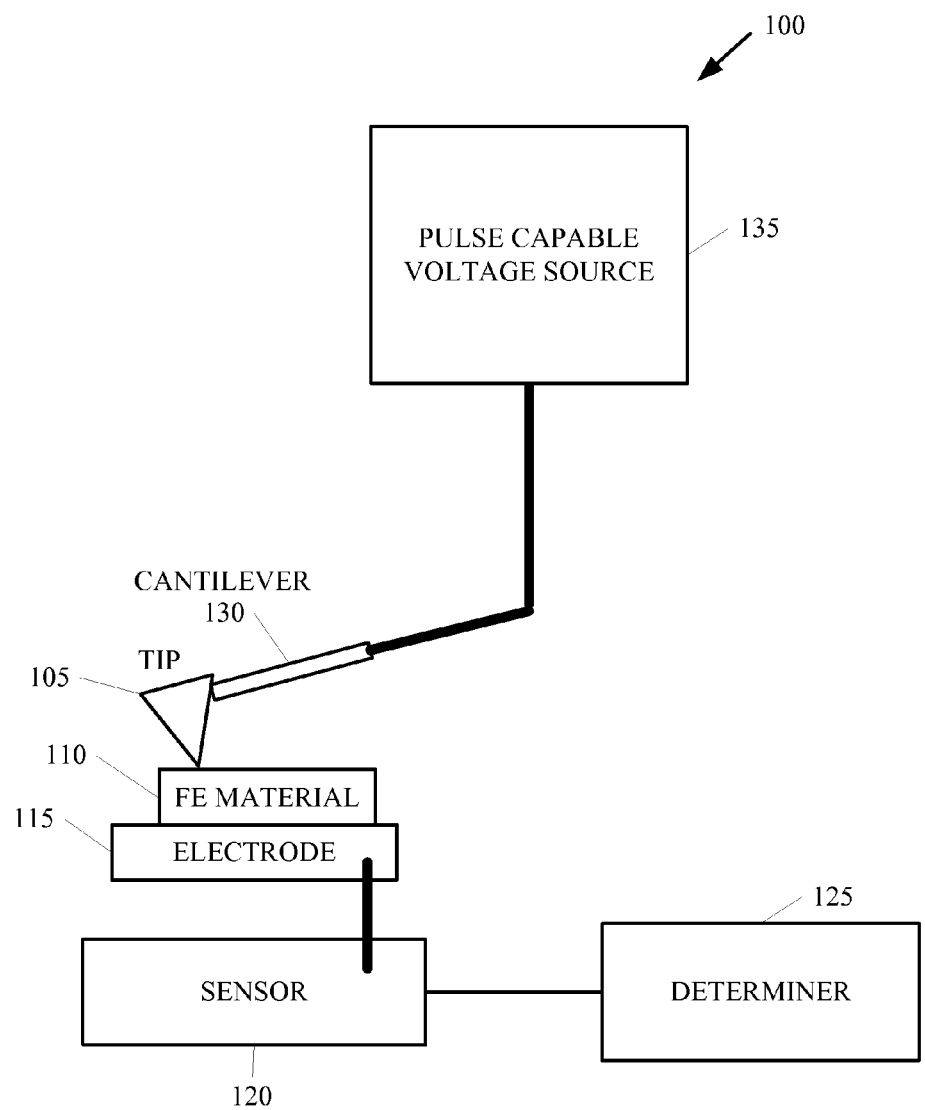

FERROELECTRIC MEMORY AND METHOD IN WHICH POLARITY OF DOMAIN OF FERROELECTRIC MEMORY IS DETERMINED USING RATIO OF CURRENTS

FIELD

The present invention is in the field of integrated circuit memory cells and, particularly, ferroelectric devices that are used as components in nonvolatile memories.

BACKGROUND

The standard techniques for reading ferroelectric (FE) media may require sophisticated cantilever designs and CMOS circuits. In addition, the standard piezoresponse force microscopy (PFM) technique may CMOS be relatively slow. PFM may determine the state or orientation of a polarization domain of FE media based upon mechanical means. The technique may measure the movement in a tip produced by applying a voltage through the FE media. In general, FE material is also piezoelectric material. The application of pressure to piezoelectric material may generate a current through the material. Conversely, in the inverse piezoelectric effect, the application of a voltage to the piezoelectric material may cause it to expand or contract. Thus, present methods of determining the state of a polarization domain may apply a current through the polarization domain. The FE material may then expand or contract. By carefully measuring the movement of a tip, the movement may be determined and thus the state of the polarization domain. In many cases, the movement may be measured by detecting the reflection of laser beams on the cantilever. The technique may be relatively slow, because there are limits to the speed at which the tip can vibrate. In addition, a newly proposed charge detection technique may require large contact force and may therefore increase tip wear.

BRIEF DESCRIPTION OF THE DRAWINGS

Aspects of the invention will become apparent upon reading the following detailed description and upon reference to the accompanying drawings in which like references may indicate similar elements:

FIG. 1 is a diagram of an embodiment of a memory which contains a ferroelectric (FE) component;

DETAILED DESCRIPTION OF EMBODIMENTS

Figure 2A:
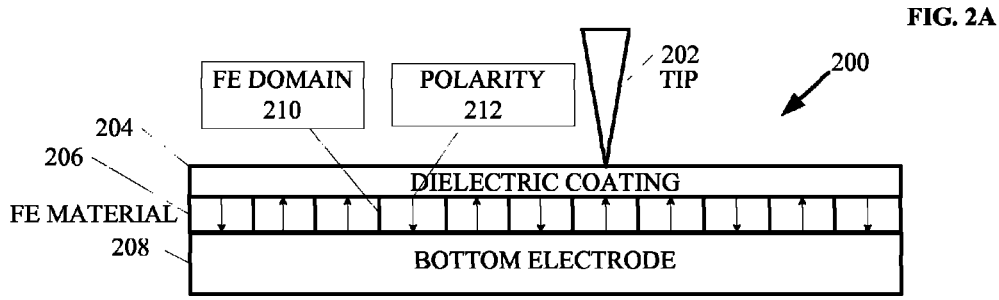
FIG. 2A is a diagram of an embodiment of layers of materials in a memory which contains an FE component.

The following is a detailed description of embodiments of the invention depicted in the accompanying drawings. The embodiments are in such detail as to clearly communicate the invention. However, the amount of detail offered is not intended to limit the anticipated variations of embodiments; but on the contrary, the intention is to cover all modifications, equivalents, and alternatives falling within the spirit and scope of the present invention as defined by the appended claims.

Generally speaking, systems and methods for data storage are contemplated. Embodiments include applying a first voltage between a tip and an electrode, thereby forming a polarized domain in a ferroelectric (FE) material between 1 nanometer (nm) and 50 nm in thickness. The embodiments may also include applying another voltage through the tip, thereby generating a current responsive to an orientation of the polarized domain. The embodiments may also include measuring the current and determining the orientation of the polarized domain, based upon the measuring.

FIG. 1 is a diagram of an embodiment of a FE memory 100 which contains a ferroelectric (FE) component. The FE memory 100 includes tip 105, FE material 110, electrode 115, sensor 120, determiner 125, cantilever 130, and pulse capable voltage source 135. FE memory 100 may operate by forming regions of polarization (polarized domains) in FE material 110 (writing to memory), and determining the state or orientation of the polarized domains (reading). Tip 105 may travel across the surface or in near contact with the surface of FE material 110 and may apply voltage to FE material 110 to form and determine the state of orientation of the polarized domains of FE material 110. The portion of tip 105 nearest polarization domain FE material 105 may form a sharp point. Tip 105 may be of pyramidal or conical shape, or other shape that comes to a sharp point. The portion of tip 105 that comes in contact with FE material 105 or remains slightly above it may be as small as several nanometers. Tip 105 may be made of silicon and may be covered with a film such as Pt for protection. The radius of curvature of the tip may be in the range of 20-30 nm.

Tip 105 is connected through cantilever 130 to pulse capable voltage source 135. Pulse capable voltage source 135 may supply power both for writing to FE memory 100 and for reading from FE 100. Typically, pulsed voltages may be used to write and constant bias could be used to read, but in some embodiments, pulsed voltages may also be used to read.

FE material 110 is ferroelectric. Regions of a FE material such as FE material 110 may form two stable polarization states. These two states may be used to represent the 0's of 1's of computer storage. Creating a state may correspond to writing a 0 or 1 to a bit of memory, and determining the state may correspond to reading a bit of memory. In some FE materials, the polarization states may remain stable without a power supply on the order of 20 years. Thus, some FE materials may serve as non-volatile memory.

In a polarized state, positive ions may separate from electrons, producing a region portion of which has a net negative charge and a portion of which has a net positive charge. A polarized state may be identified by the orientation of the vector from positive charge to negative charge. Within the region (polarization domain), the orientation of the vectors may be uniform. The polarization domains may exist on nanoscale. Some domains may have a radius or width of approximately 5 to 20 nm and a depth of a few nm. The small size of the polarization domains may enable very dense non-volatile RAM storage.

FE material 110 may be between 1 nm and 50 nm thick. FE material 110 may include various types of commercial lead zirconate-titanate ceramics (PZT), $LiNbO_3$, $LiTiO_3$, 95% $BaTiO_3$/5% $CaTiO_3$, $BaTiO_3$ polycrystals, epitaxial ferroelectric thin films of $SrBi_2Ta_2O_9$ (SBT), $Bi_4Ti_3O_{12}$, $BaBi_4Ti_4O_{15}$, or other substances known to those of skill in the art. These FE materials may be formed by pulsed laser deposition onto epitaxial layers of electrically conductive $LaNiO_3$, $SrRuO_3$, doped $SrTiO_3$, or other suitable substrates, may be deposited using the chemical solution deposition method, or fabricated using electron beam direct writing, a form of electron beam lithography.

In the embodiment of FIG. 1, writing and reading to FE memory 100 may be carried out by applying voltage from pulse capable voltage source 135 through tip 105 to FE material 110. Writing may consist of an application of voltage across a polarized domain of sufficient strength to change the orientation or state of the domain. Provided the applied field is of sufficient strength, the application of voltage may cause the dipoles of the domain to line up along the direction of the applied field.

Reading may consist of applying a typically lower voltage to a polarized domain of FE material 110 and measuring the amount of current produced by the voltage. In the embodiment of FIG. 1, the state of the polarized domain may affect the amount of current produced by the voltage. When the applied voltages produce an electron flow into the negatively charged portion of the polarized domain, the FE material such as the FE material 110 may resist the voltage, allowing only a relatively small current to flow through the FE material. Conversely, when the applied voltages produce an electron flow into the positively charged portion of the polarized domain, a relatively larger current may be produced. In effect, the domain structure may have the same effect as a built-in voltage. Thus, measuring the current produced by applying voltage to a polarized domain may determine the state or orientation of the polarized domain.

In some embodiments, FE material 110 may be between 1 nm and 5 nm in thickness and dielectric. Reading may consist of measuring a tunneling current produced by applying a voltage to FE material 110. In other embodiments, FE material 110 may be slightly conductive, and between 5 nm and 50 nm in thickness. In these embodiments, applying a voltage may produce a current that may be measured.

In the embodiment of FIG. 1, the voltage used for determining the state of polarity of FE material 110 may be a bipolar voltage. For example, a positive and negative voltage may be applied to FE material 110 in alternation, and the current produced by each measured by sensor 120. The state of polarization may be determined by comparing the magnitudes of the resulting currents or taking their ratios. This comparison may provide greater accuracy than relying on the magnitude of the current produced by a single voltage, because of impurities and other factors.

Electrode 115 may complete a circuit for the application of voltage to FE material 110. Electrode 115 may be made of $SrRuO_3$, $SrTiO_3$ doped with niobium or other suitable substances, $LaNiO_3$, or other substances known to those of skill in the art. Sensor 120 may measure the current produced by applying voltages, such as the voltages from pulse capable voltage source 135, to FE material 110. Determiner 125 may determine the state or orientation of a polarization domain of FE material 110 based upon the measurement of the current from sensor 120.

Determining the state of the FE memory 100 by measuring the current produced by applying a voltage may enable faster, longer-lasting memory with simpler components than present methods. Present methods may determine the state or orientation of a polarization domain of FE material based upon a mechanical motion of a tip, rather than upon the measurement of a current. The measurement of a current produced by the FE memory may be performed much faster than the mechanical motion of the tip. In addition, an accurate measurement of the motion may require the tip to approach or even touch the FE material. As a result, present methods may produce greater wear on the tip than the method of FIG. 1. Finally, the circuitry required to measure the very small motion of the tip may be highly complex. The circuitry needed to measure the current produced may be simpler.

The FE memory 100 which contains a ferroelectric (FE) component illustrated in FIG. 1 is for explanation, not for limitation. FE memory useful according to various embodiments of the present invention may include additional components or may omit some of the components shown. In some embodiments, the voltage used for determining the state of the polarization domain may be mono-polar rather than bipolar. In many embodiments, multiple layers may lie between a tip and an electrode. The layer next to the tip may consist of non-FE material. In some embodiments, the current which is measured to determine the orientation of polarized domains of FE material may not run through the FE material. In further embodiments, the voltage which is applied to create the currents is not applied to the FE material, but to other layers. FIGS. 2A through 3D illustrate some other possible arrangements of layers of material between a tip such as tip 105 and an electrode such as electrode 115. In other embodiments, the components shown in FIG. 1 may be attached to different positions of a circuit. For example, a pulse capable voltage source (currently shown attached to the tip) and a sensor/determiner (currently attached to the sample) could swap positions and still maintain functionality.

Turning to FIGS. 2A through 3D, illustrated are embodiments of layers of materials (200, 216, 230, 244, 300, 315, 330, and 350) which may lie between a tip and an electrode in a memory which contains an FE component. For purposes of illustration, the figures are described from an orientation with the tip on the top and the electrode on the bottom. The description is not a limitation. The tip, electrode, and layers may be oriented in any direction. All eight embodiments include a tip (202, 218, 232, 246, 302, 316, 332, and 352), a FE material (206, 220, 234, 250, 306, 318, 334, and 358), and a bottom electrode (208, 224, 238, 254, 308, 322, 338, and 360). The diagram of the FE material shows a sample FE polarity domain (210, 226, 240, 256, 310, 324, 340, and 362), illustrated by a rectangular cell. An arrow in each cell (up or down) illustrates the polarity of the cell, as in sample polarities (212, 228, 242, 260, 312, 326, 342, and 364). In the embodiments of FIGS. 2A through 3D, the domain orientation of a polarization domain of the FE material (206, 220, 234, 250, 306, 318, 334, and 358) may affect the current produced by applying a voltage through the tip (202, 218, 232, 246, 302, 316, 332, and 352). Thus, measurement of the current may determine the domain orientation.

Figure 2B:
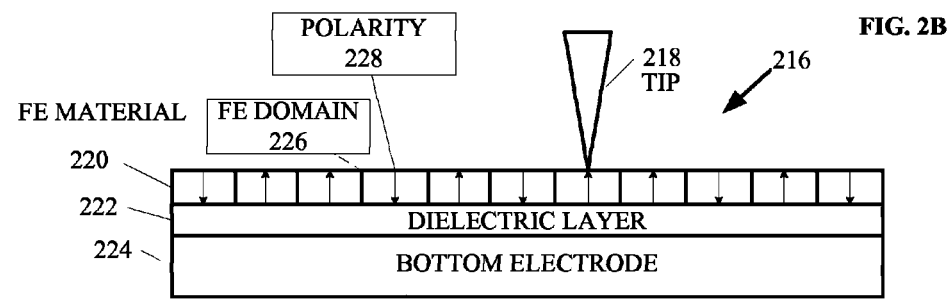
FIG. 2B is another diagram of an embodiment of layers of materials in a memory which contains an FE component.
Figure 2C:
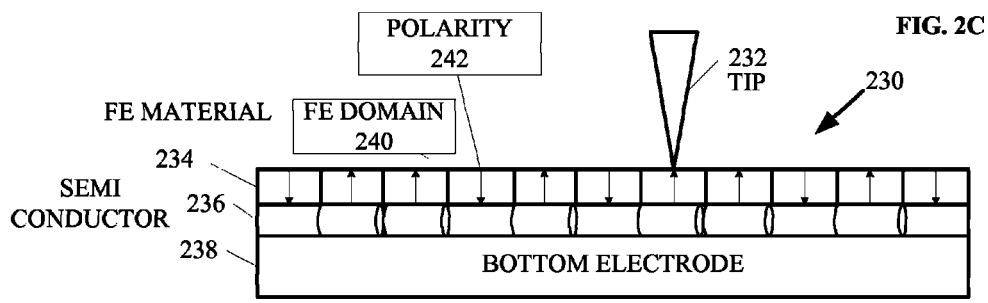
FIG. 2C is another diagram of an embodiment of layers of materials in a memory which contains an FE component.

In FIGS. 2A through 2C, the FE material (206, 220, and 234) is between 1 nm and 5 nm in thickness (ultra-thin). This thickness may enable a tunneling current to pass through the FE material (206, 220, and 234). In general, FE material may be dielectric, that is, may be resistant to the passage of current. An ultra-thin FE material layer may permit current to pass through in accordance with the quantum mechanical mechanism of tunneling. The wave nature of particles such as electrons allows for the possibility that a particle penetrates a thin barrier even if the particle energy is less than the energy height of the barrier.

FIG. 2A is a diagram of an embodiment of the layers 200 accompanying a layer of FE material in a memory. In addition to the layers described above, FIG. 2A also includes dielectric coating 204, located between tip 202 and FE material 206.

The dielectric coating 204 may provide protection to the tip 202, to the FE material 206, or may provide additional traction for a sliding tip. Dielectric coating 204 is between 1 and 5 nm in thickness, to permit tunneling of the current used to form polarization domains in FE material 206 and the current used to determine the state or orientation of the polarization domains. The tunneling process through the two ultra-thin layers, the dielectric coating 204 and the FE material 206 may be heavily influenced by the orientation of a polarization domain of the FE material 206.

To eliminate possible inconsistency caused by surface contamination, a bipolar pulse may be used to generate tunneling currents through the layers 200 of FIG. 2A, the tunneling currents may be measured, and the ratio calculated. Surface contamination may affect the absolute magnitude of current generated through FE material 206 by a voltage. By sending both a positive pulse and a negative pulse through the FE material 206, it may be determined which pulse produces a greater current and therefore the orientation of a polarization domain of FE material 206.

FIG. 2B is similar to FIG. 2A, except that the dielectric layer 222 is located between the FE material 220 and the bottom electrode 224. Again, dielectric layer 222 is between 1 and 5 nm in thickness, to enable tunneling. Similar to FIG. 2A, the tunneling process through the ferroelectric/dielectric stack may be highly influenced by the domain orientation of a polarization domain. The addition of dielectric layer 222 may improve the gross properties of the films layers 216.

The film layers 230 of FIG. 2C include a semi-conductor layer 236 between FE material 234 and bottom electrode 238. The tunneling process through the FE material 234 may be highly influenced by the domain orientation. In addition, the semiconductor 236/bottom electrode 238 Schottky barrier might be sensitive to the domain orientation because the carrier distribution in the semiconductor 238 may be influenced by the domain orientation. The Schottky barrier is a barrier to current flow through a metal-to-semiconductor junction, such as the junction between bottom electrode 238 and semiconductor 236. The electrons in one of the materials, such as the bottom electrode 238, may have lower energy than the electrons in the other material, such as semiconductor 236. Therefore, when the materials are joined, some of the electrons in the semiconductor, such as semiconductor 236, may move spontaneously into the metal, such as bottom electrode 238, and collect on the surface. This movement of electrons may create a region of positive charges on the semiconductor, caused by the ionized donor locations of the electrons; and create a negative surface charge where they collect on the surface of the metal. An electric field may be set up between these positive charges and the negative charges that may inhibit further electron flow into the metal. The positively charged region is called a depletion region, since it is almost completely depleted of mobile electrons.

The strength of the Schottky barrier created by the junction of semiconductor 236 and bottom electrode 238 may be influenced by the state or orientation of the polarization of FE material 234. An orientation in which a region of negative charges in the FE material 234 lie opposite the region of positive charges in the semiconductor 236 may cause an attraction between the two sets of charges and may increase the size of the Schottky barrier. Conversely, an orientation in which a region of positive charges in the FE material 234 lie opposite the region of positive charges in the semiconductor 236 may cause a repulsion, and may reduce the size of the Schottky barrier.

Figure 2D:
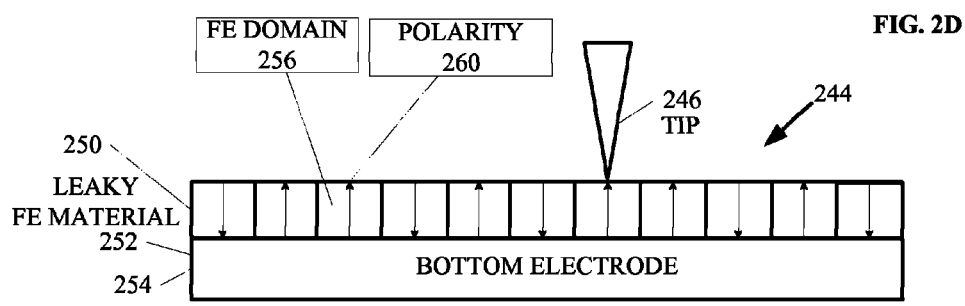
FIG. 2D is another diagram of an embodiment of layers of materials in a memory which contains an FE component.
Figure 3A:
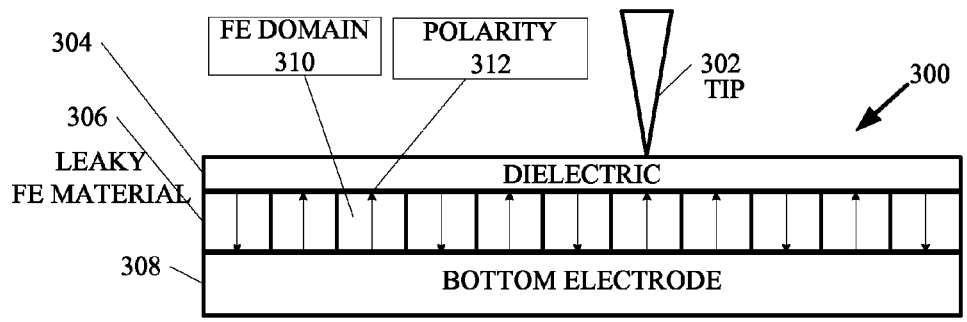
FIG. 3A is another diagram of an embodiment of layers of materials in a memory which contains an FE component.
Figure 3B:
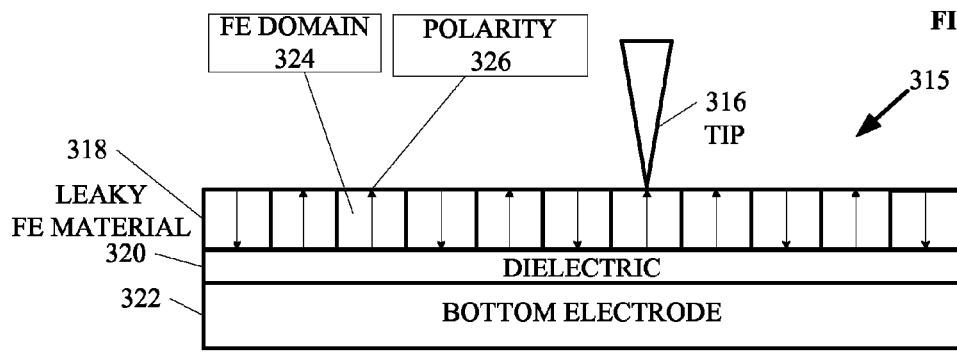
FIG. 3B is another diagram of an embodiment of layers of materials in a memory which contains an FE component.
Figure 3C:
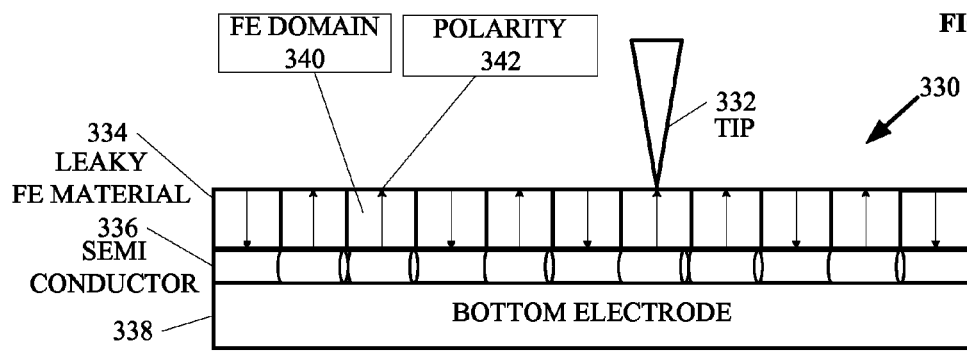
FIG. 3C is another diagram of an embodiment of layers of materials in a memory which contains an FE component.
Figure 3D:
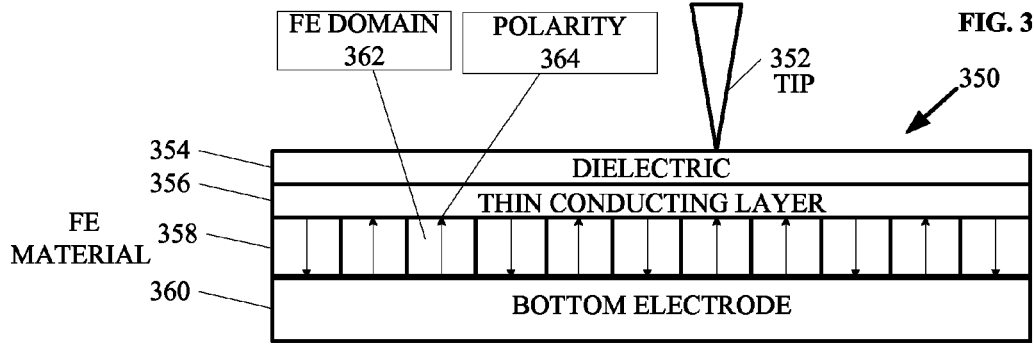
FIG. 3D is another diagram of an embodiment of layers of materials in a memory which contains an FE component.

In FIGS. 2D through 3D, the FE material (250, 306, 318, 334) is between 5 nm and 50 nm in thickness. This thickness may prevent a tunneling current from passing through the FE material (250, 306, 318, 334). In FIGS. 2D through 3C, the FE material (250, 306, 318, 334) may be slightly conductive (leaky). For example, the FE material (250, 306, 318, 334) may permit the passage of current because of impurities, such as those created by doping. A leaky FE material may have the properties of a semiconductor. In FIG. 3D, however, the FE layer 358 is dielectric.

FIG. 2D includes a leaky FE material 250 between a tip 246 and a bottom electrode 254. Because it may have semiconductor properties, a Schottky barrier may form between the leaky FE material 250 and the bottom electrode 254, and between the leaky FE material 250 and the tip 246. The orientation of a polarization domain of the leaky FE material 250 might change the Schottky barrier between the leaky FE material 250 and the bottom 254 electrode and that between the leaky FE material 250 and the tip 246 and may therefore causing switching behavior. In other words, in one orientation, an application of voltage through the tip 246 and the bottom electrode 254 may cause a significant flow of current through the polarization domain; while in another orientation, an application of the same amount of voltage may cause at most a small current flow.

FIG. 3A adds to the apparatus of FIG. 2D a dielectric coating 304 between the tip 302 and the leaky FE material 306. The dielectric coating 304 may provide protection to the tip 302 or to the leaky FE material 306, or may provide additional traction for a sliding tip. Dielectric coating 304 is between 1 and 5 nm in thickness, to permit tunneling of the current used to form polarization domains in the leaky FE material 306 and the current used to determine the state or orientation of the polarization domains. The tunneling process through the dielectric coating 304 may be heavily influenced by the orientation of a polarization domain of the leaky FE material 306. In addition, a Schottky barrier between the leaky FE material 306 and the bottom electrode 308 might be sensitive to domain orientation. Thus, measurement of a current caused by applying a voltage between tip 302 and bottom electrode 308 might determine the orientation of a polarization domain of the leaky FE material 306.

FIG. 3B is similar to FIG. 3A, except that the dielectric layer 320 is located between the leaky FE material 318 and the bottom electrode 322. Again, dielectric layer 320 is between 1 and 5 nm in thickness, to enable tunneling. The tunneling process through the dielectric layer 320 may be highly influenced by the domain orientation of a polarization domain. The addition of dielectric layer 320 may improve the gross properties of the films layers 315. In addition, a Schottky barrier between the leaky FE material 318 and the tip 316 might be sensitive to domain orientation.

FIG. 3C includes a semiconductor layer 336 between a leaky FE layer 334 and the bottom electrode 338. In some embodiments, the leaky FE material 334 may be between 10 nm and 50 nm in thickness. The Schottky barrier between the FE layer 334 and the tip 332 might be sensitive to domain orientation. In addition, the semiconductor 336/bottom electrode 338 Schottky barrier might be sensitive to the domain orientation because the carrier distribution in the semiconductor 336 may be influenced by the domain orientation.

FIG. 3D includes an ultra-thin (between 1 and 5 nm in thickness) dielectric coating 354 on top of an ultra-thin conducting layer 356, which is on top of FE layer 358. FE layer 358 is dielectric. In some embodiments, the FE layer 358 may be between 10 nm and 50 nm in thickness. The thin conducting layer 356 may have a low carrier density so that the Thomas-Fermi length is at least as large as the thickness of the conducting layer 356. Under this condition, the electrons of the conducting layer 356 may affect the FE layer 358. It may, then, be possible to form polarized regions in the FE layer 358 through the dielectric layer 354/conducting layer 356 stack. The tunneling process from tip 352 to the thin conducting layer 356 through the dielectric coating 354 may be highly influenced by the orientation of polarized domains of FE layer 358. In the embodiment of FIG. 3D, the application of a voltage to determine the domain orientation may create a circuit which does not extend through the FE layer 358. A sensor to measure the current may be attached to the thin conducting layer 356 rather than to the bottom electrode 360.

Figure 4:
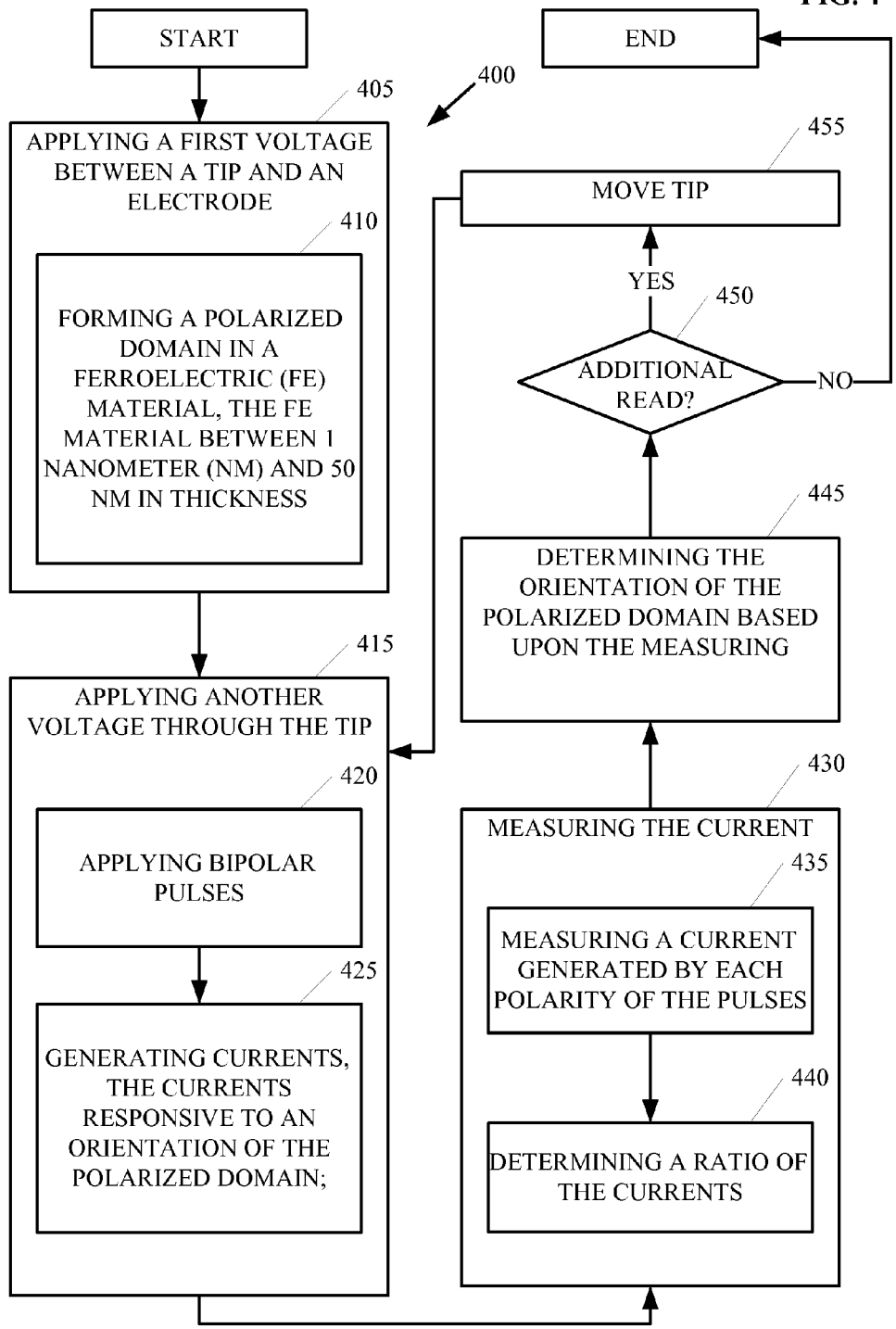
FIG. 4 is a flowchart of an embodiment of a method to store data in a memory which contains an FE component.

FIG. 4 depicts a flowchart 400 of an embodiment of a method for data storage. The method of flowchart 400 may be carried out by a FE memory such as FE memory 100 depicted in FIG. 1. Flowchart 400 of FIG. 4 may include applying a first voltage between a tip and an electrode (element 405). The tip may come to a sharp point on the scale of a few nanometers. The application of the voltage may form a polarized domain in a FE material, between 1 nm and 50 nm in thickness (element 410). In some embodiments, the FE material may be dielectric, between 1 and 5 nm in thickness. A tunneling current may be capable of flowing through it. In other embodiments, the FE material may be leaky, between 5 nm and 50 nm in thickness. In further embodiments, the leaky FE material may be between 10 nm and 50 nm in thickness. In still other embodiments, the FE material may be dielectric, between 5 nm and 50 nm in thickness.

The method of flowchart 400 includes applying another voltage through the tip (element 415). The other voltage may include a bipolar pulse (element 420). The application of the bipolar pulse may produce currents responsive to an orientation of the polarized domain created by the first voltage (element 425). For example, under one orientation of the polarized domain, the current produced by one of the bipolar pulses may be stronger than the current produced by the other of the bipolar pulses. Under another orientation of the polarized domain, the current produced by one bipolar pulse may be weaker than the current produced by the other of the bipolar pulses.

A sensor may measure the current (element 435). The measuring may include measuring a current generated by each polarity of the pulses (element 435), and determining a ratio of the currents (element 440). A processor may determine the orientation of the polarized domain, based upon the measuring (element 445). A lower ratio of currents may indicate one orientation, while a higher ratio may indicate another orientation. The creation of polarized domains and the determining of the orientations (elements 410 and 445) may constitute writing and reading to a FE memory. Writing consists of creating a polarized domain with a particular orientation, and reading consists of determining the orientation of the polarized domain.

If the FE memory is requested to make additional reads (element 450), it may move the tip (element 455) and repeat each element of flowchart 400 from element 415 through element 445. Otherwise, the method of flowchart 400 may end.

The elements of FIG. 4 are for illustration and not limitation. In some embodiments, current may be generated by a single pulse, rather than by a polarized pulse, and the orientation of a polarized domain may be determined from an absolute measurement rather than from a ratio of two measurements.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

It will be apparent to those skilled in the art having the benefit of this disclosure that the present invention contemplates methods and arrangements for data storage. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for data storage, the method comprising:
applying a first voltage between a tip and an electrode, the applying comprising forming a polarized domain in a ferroelectric (FE) material, the FE material between 1 nanometer (nm) and 50 nm in thickness;
applying a second voltage through the tip, the applying the second voltage comprising generating a first current between the tip and the electrode, wherein:
the first current is responsive to an orientation of the polarized domain; and
the second voltage is a lower voltage than the first voltage, and
applying the second voltage does not change the orientation of the polarized domain;
applying a third voltage through the tip, the applying the third voltage comprising generating a second current between the tip and the electrode, wherein:
the second current is responsive to the orientation of the polarized domain;
the third voltage is a lower voltage than the first voltage;
applying the third voltage does not change the orientation of the polarized domain; and
applying the second voltage and applying the third voltage comprise applying bipolar pulses;
measuring the first current;
measuring the second current; and
determining the orientation of the polarized domain, the determining based upon a ratio, wherein the ratio is selected from the group consisting of the quotient produced by dividing the measurement of the first current by the measurement of the second current and the quotient produced by dividing the measurement of the second current by the measurement of the first current.

2. The method of claim 1, wherein:
the FE material is between 1 nm and 5 nm in thickness;
generating the first current comprises generating a first tunneling current through the FE material;
generating the second current comprises generating a second tunneling current through the FE material; and
the measuring the first current and measuring the second current comprises measuring the first and second tunneling currents generated through the FE material.

3. The method of claim 1, wherein:
generating the first current comprises generating a tunneling current through a dielectric coating;
the dielectric coating is between 1 nm and 5 nm in thickness;
the dielectric coating lies between the FE material and the electrode; and
a path between the tip and the electrode goes through the dielectric coating.

4. A ferroelectric (FE) memory, the FE memory comprising:
a FE material between 1 nanometer (nm) and 50 nm in thickness, the FE material containing a domain capable of multiple states of polarity, the domain of the FE material to assume one of the multiple states of polarity upon application of a voltage;
a tip, an application of a first voltage through the tip to induce a first current responsive to a state of polarity of the domain of the FE material; and an application of a second voltage through the tip to induce a second current responsive to a state of polarity of the domain of the FE material, the application of the first voltage and the second voltage not to change the state of polarity, wherein applying the first voltage and applying the second voltage comprise applying bipolar pulses;
an electrode, an application of voltage between the tip and the electrode to place the domain of the FE material in one of the multiple states of polarity;
a sensor to measure the induced first current and the induced second current; and
a determiner to determine the state of polarity of the domain of the FE material, the determination based upon the measurement of the induced first current, upon the measurement of the induced second current, and upon the ratio of the induced first current and the induced second current, wherein the ratio is selected from the group consisting of the quotient produced by dividing the measurement of the induced first current by the measurement of the induced second current and the quotient produced by dividing the measurement of the induced second current by the measurement of the induced first current.

5. The FE memory of claim 4, wherein:
the FE material is between 1 nm and 5 nm in thickness, and
the application of the first and second voltage through the tip is to induce the first and second current in the FE material.

6. The FE memory of claim 5, further comprising:
a dielectric coating between 1 nm and 5 nm in thickness, the dielectric coating lying between the FE material and the electrode, and the application of the first and second voltage through the tip to induce a first and second tunneling current through the dielectric coating, the first and second tunneling current responsive to the state of polarity of the domain of the FE material.

7. The FE memory of claim 5, wherein:
the FE memory further comprises a dielectric coating between 1 nm and 5 nm in thickness, the dielectric coating lying between the tip and the FE material;
the application of the first voltage through the tip is to induce a first tunneling current through the dielectric coating, the tunneling current responsive to the state of polarity of the domain of the FE material; and
the application of the second voltage through the tip is to induce a second tunneling current through the dielectric coating, the tunneling current responsive to the state of polarity of the domain of the FE material.

8. The FE memory of claim 5, further comprising a semiconductor layer lying between the FE material and the electrode, the semiconductor layer and the electrode forming a Schottky barrier.

9. The FE memory of claim 4, wherein a radius of the domain is between 5 nm and 20 nm and a depth of the domain is at most 5 nm.

10. The FE memory of claim 4, wherein the domain is capable of maintaining a state of polarity without a power supply for 20 years.

11. The FE memory of claim 4, the FE material comprising one or more of the following materials:
commercial lead zirconate-titanate ceramics (PZT);
$LiNbO_3$;
$LiTiO_3$;
95% $BaTiO_3$/5% $CaTiO_3$;
$BaTiO_3$ polycrystals;
epitaxial ferroelectric thin film of $SrBi_2Ta_2O_9$ (SBT);
epitaxial ferroelectric thin film of $Bi_4Ti_3O_{12}$; or
epitaxial ferroelectric thin film of $BaBi_4Ti_4O_{15}$.

12. The FE memory of claim 4, wherein the FE material was formed by one of the following processes:
pulsed laser deposition onto epitaxial layers of electrically conductive $LaNiO_3$, $SrRuO_3$, or doped $SrTiO_3$;
deposition using a chemical solution deposition method; or
fabrication using electron beam direct writing.

13. The FE memory of claim 4, the tip of pyramidal or conical shape, the tip comprising:
a sharp point on a portion of the tip nearest the FE material; and
a film covering the tip.

14. The FE memory of claim 13, wherein the film comprises platinum (Pt).

15. The FE memory of claim 4, wherein the FE material comprises a leaky FE material between 5 nm and 50 nm in thickness.

16. The FE memory of claim 15, further comprising a dielectric coating between 1 nm and 5 nm thickness lying between the tip and the leaky FE material, wherein the first induced current and the second induced current constitute tunneling currents.

17. The FE memory of claim 15, further comprising a dielectric coating between 1 nm and 5 nm thickness lying between the leaky FE material and the electrode, wherein the first induced current and the second induced current constitute tunneling currents.

18. The FE memory of claim 15, further comprising a semiconductor layer lying between the leaky FE material and the electrode, the semiconductor layer and the electrode forming a Schottky barrier.

19. The FE memory of claim 4, wherein:
the FE memory further comprises:
- a dielectric coating of 1 to 5 nm; and
- a conducting layer lying between the dielectric coating and the FE material, the conducting layer of low carrier density and between 1 nm and 5 nm in thickness;

the FE material is between 5 nm and 50 nm in thickness; and the first induced current and the second induced current constitute tunneling currents to flow through the dielectric coating and into the conducting layer.

20. A ferroelectric (FE) memory, the FE memory comprising:
- a FE material between 1 nanometer (nm) and 50 nm in thickness, the FE material containing a domain capable of multiple states of polarity, the domain of the FE material to assume one of the multiple states of polarity upon application of a voltage;
- an electrode;
- a tip to conduct current passing through the FE material;
- a pulse capable voltage source connected to the electrode to:
  - apply a first and a second voltage to induce a first and second current responsive to a state of polarity of the domain of the FE material, wherein:
    - the first voltage is positive and the second voltage is negative, or the first voltage is negative and the second voltage is positive; and
    - the application of the first voltage and application of the second voltage are not to change the state of polarity of the domain; and
  - apply a third voltage to place the domain of the FE material in one of the multiple states of polarity;
- a sensor connected to the tip to measure the induced first current and the induced second current; and
- a determiner to determine the state of the domain of the polarized structure based upon a ratio of the induced first current and the induced second current, wherein the ratio is selected from the group consisting of the quotient produced by dividing the measurement of the induced first current by the measurement of the induced second current and the quotient produced by dividing the measurement of the induced second current by the measurement of the induced first current.

* * * * *